(12) United States Patent
Tatoh et al.

(10) Patent No.: US 6,588,948 B2
(45) Date of Patent: Jul. 8, 2003

(54) OPTICAL COMMUNICATION MODULE HAVING A CONSTANT PLANE OF POLARIZATION OF TRANSMITTED LIGHT

(75) Inventors: Nobuyoshi Tatoh, Itami (JP); Hiromi Iwamoto, Itami (JP); Takaaki Hirose, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 09/943,008

(22) Filed: Aug. 31, 2001

(65) Prior Publication Data

US 2002/0044748 A1 Apr. 18, 2002

(30) Foreign Application Priority Data

Sep. 1, 2000 (JP) .......................................... 2000-265418
May 16, 2001 (JP) .......................................... 2001-146889

(51) Int. Cl.⁷ ................................................. G02B 6/36
(52) U.S. Cl. ............................. 385/93; 385/92; 385/94
(58) Field of Search ............................... 385/92, 93, 94

(56) References Cited

U.S. PATENT DOCUMENTS

| | | | | |
|---|---|---|---|---|
| 5,291,571 A | * | 3/1994 | Kunikane et al. | ............ 359/494 |
| 5,590,148 A | * | 12/1996 | Szarmes | .................... 372/105 |
| 5,637,881 A | * | 6/1997 | Burghard et al. | ......... 250/222.2 |
| 5,945,721 A | | 8/1999 | Tatoh | ........................ 257/434 |
| 6,366,389 B1 | * | 4/2002 | Wraback et al. | ............. 359/244 |
| 6,396,979 B1 | * | 5/2002 | Freud et al. | .................... 385/34 |
| 6,433,942 B1 | * | 8/2002 | Memezawa et al. | ......... 359/833 |

FOREIGN PATENT DOCUMENTS

| JP | 11-54642 | 2/1992 | ............... 385/92 X |
|---|---|---|---|
| JP | 8-148594 | 6/1996 | ............... 385/92 X |

* cited by examiner

Primary Examiner—Brian Healy
Assistant Examiner—Daniel Petkovsek
(74) Attorney, Agent, or Firm—McDermott, Will & Emery

(57) ABSTRACT

An optical module has a housing, and a junction having a light transmissive window structure, which is fixed to the housing, and which utilizes a sapphire plate. The following expressions (1) through (4) are established between an angle φ formed by the C axis of the sapphire, and the plane of polarization of light, and an angle θ formed by the C axis of the sapphire and the optical axis. ω is the principal refractive index of sapphire, ε is the secondary refractive index, λ is the wavelength of transmitted light, and d is the thickness of the window plate.

$$n = \omega\epsilon/\sqrt{(\omega^2\cos^2\theta + \epsilon^2\sin^2\theta)} \qquad (1)$$

$$\delta = 2\pi d(\omega - n)/\lambda \qquad (2)$$

$$\tan\beta = \frac{\sqrt{(\sin^2 2\psi \sin^2 \delta + 1)} - 1}{\sin 2\psi \sin \delta} \qquad (3)$$

$$-30 \geq +20\log(\tan\beta) \qquad (4)$$

7 Claims, 5 Drawing Sheets

OPTICAL COMMUNICATION MODULE HAVING A CONSTANT PLANE OF POLARIZATION OF TRANSMITTED LIGHT

BACKGROUND OF THE INVENTION

1. Field of the Invention

The present invention relates to an optical module used in optical communications, and more particularly to an optical module, which has high airtightness, and a constant plane of polarization of transmitted light.

2. Description of the Related Art

In the field of optical communications, which has developed phenomenally in recent years, optical module airtightness is seen as being important for the reliable transmission of a light signal. This results from the electrode of an optical semiconductor device arranged on the inside of an optical module deteriorating when, the inside thereof constitutes a high-temperature, high-humidity state, and from the optical properties of an optical semiconductor device deteriorating due to the condensing of moisture that penetrates to the inside, making it impossible to guarantee the life of an optical semiconductor device for more than 10 years.

However, an optical module has the role of using a lens to optically couple an inside optical semiconductor device and an outside optical fiber. To ensure the airtightness of an optical module as-is and maintain the optical system thereof, a, light transmitting-type window structure is employed in an optical semiconductor airtight-sealed housing.

As the window material of the housing (airtight-sealed housing) for an optical module, sapphire is often utilized due to its excellent translucence and high strength. Japanese Patent Application Laid-open No. H8-148594 discloses a basic structure and manufacturing method of a housing for an optical module, which uses sapphire in a light transmitting-type window. Regarding to the window structure of the housing thereof, Japanese Patent Application Laid-open No. H8-148594 discusses the relationship between the optical axis and the C axis of the sapphire. Here, a window structure is proposed, in which an optical axis, which refracts according to Snell's law, is made coincident with the C axis of the window plate, so that occurrence of light birefringence, that is, rotation of the plane of polarization of light is prohibited.

In Japanese Patent Application Laid-open No. H11-54642, an optical module window structure, which uses borosilicate glass as the window plate, is proposed. Borosilicate glass is inexpensive, and its translucency surpasses even that of sapphire. Furthermore, borosilicate glass is an isotropic material, and does not cause the birefringence of light. However, the problem with borosilicate glass is that the plane of linear polarization of transmitted light deforms, namely the plane is not maintained as-is and the light changes into ellipsoidal polarization in some cases, due to the elastic strain resulting from heat stress. But as disclosed in Japanese Patent Laid-open No. 11-54642, it has become clear that the deformation of the plane of polarization of light can be minimized by applying a stress uniformly to the glass, at which time the polarized light extinction ratio described below, which serves as an index of the deformation of the plane of polarization of light, decreases to around −40 dB, and does not pose a problem from the standpoint of practical use.

Here, the deformation of the plane of polarization of light is generally expressed as a polarized light extinction ratio such as the following. In a crossed Nicol prism experimental system, when the polarizer of the light-emitting side was made to rotate 90 degrees relative to that of the light-receiving side, if the maximum light intensity in the light-receiving side is labeled $I_{max}$, and the minimum light intensity is labeled $I_{min}$, then the polarized light extinction ratio is defined as $10 \times \log_{10}(I_{min}/I_{max})$. Therefore, this indicates that the smaller the polarized light extinction ratio is, the smaller the deformation of the plane of polarization of light becomes.

In line with the recent advances in technology for increasing transmission speeds and high-density wavelength-multiplexing technology in optical communications, maintaining the constant plane of polarization of transmitted light and ensuring the uniformity of the wavelength thereof have become important tasks. To solve for the latter of these, it is desirable to form an external resonator structure, such as an optical fiber grating, via an optical fiber on the outside of an airtight-sealed housing, but maintaining the constant plane of polarization of light is required in this case as well. The level of plane of polarization maintenance required at this time is the above-mentioned polarized light extinction ratio of −30 dB, that is, a level at which $I_{max}$ is 1000-times greater than $I_{min}$, making this a stringent condition incapable of being achieved with the above-mentioned conventional technology.

Furthermore, in the above-mentioned conventional technology, which uses sapphire as the window plate, a method such as the following had to be utilized to achieve the desired relationship between an optical axis and the C axis of sapphire. That is, it was necessary either to use a sapphire plate, which had been cut perpendicular to the C axis, and to make the C axis correspond to the optical axis by arranging the sapphire plate thereof perpendicular to the optical axis, or, when that was not the case, to go to the trouble of grinding and manufacturing a sapphire plate, having a specified angle relative to the C axis, and furthermore, aligning the C axis position of the sapphire plate thereof exactly with the optical axis. In the case of the former, reflected light directly returns to the incoming side, making it unsuitable for an optical module. In the case of the latter, exact alignment was difficult, and it was impossible to manufacture a window part by accurately fixing the angle.

Further, even when borosilicate glass is used as the window plate, borosilicate glass has the drawback of having weak strength. Therefore, a borosilicate glass window plate was not suitable for use under harsher conditions, and was an unsatisfactory material for practical use. In fact, the current situation is such that the use of borosilicate glass is still being shunned in fields in which ultra-high reliability is required for undersea cables.

SUMMARY OF THE INVENTION

Accordingly, an object of the present invention is to provide an optical module having a window structure, which is easy to manufacture, has mechanical strength, and has a small polarized light extinction ratio, holding the plane of linear polarization constant.

According to the present invention, there is provided an optical module comprising:

a housing; and a junction having a light transmissive window structure which uses a sapphire plate, wherein the following expressions (1)–(4) are established between an angle ψ as viewed from the optical axis, formed by the C axis of the sapphire and the plane of polarization of light, which is linear polarization, and an angle θ formed by the C axis of the sapphire and the optical axis.

$$n = \omega\epsilon/\sqrt{(\omega^2\cos^2\theta + \epsilon^2\sin^2\theta)} \quad (1)$$

$$\delta = 2\pi d(\omega - n)/\lambda \quad (2)$$

$$\tan\beta = \frac{\sqrt{(\sin^2 2\psi \sin^2 \delta + 1)} - 1}{\sin 2\psi \sin \delta} \quad (3)$$

$$-30 \geq +20\log(\tan\beta) \quad (4)$$

where,
- ω: Principal refractive index of the sapphire
- ε: Secondary refractive index of the sapphire
- λ: Wavelength of a transmitted light
- d: Thickness of the sapphire Furthermore, according to the present invention, there is provided an optical module according to the above-mentioned optical module, wherein, when the thickness d of said sapphire plate is 0.28 mm, and N is an integer, any one of the following expressions (5) through (7) is established between said angle ψ and said angle θ.

$$6 \text{ degrees} \leq \theta \leq 10 \text{ degrees and } (90N-9) \text{ degrees} \leq \psi \leq (90N+9) \text{ degrees} \quad (5)$$

$$2 \text{ degrees} \leq \theta < 6 \text{ degrees and } (90N-32) \text{ degrees} \leq \psi \leq (90N+32) \text{ degrees} \quad (6)$$

$$10 \text{ degrees} < \theta \leq 14 \text{ degrees and } (90N-5) \text{ degrees} \leq \psi \leq (90N+5) \text{ degrees} \quad (7)$$

First, the angle ψ formed by the C axis of the sapphire and the plane of polarization of light, and the angle θ formed by the C axis of the sapphire and the optical axis will be explained using FIG. 2. In FIG. 2(A), the solid line arrow represents the optical axis, and the direction of the arrow thereof is the traveling direction of the light. The rectangle in the center of FIG. 2(A) is a cross-section of a sapphire plate, and the broken line arrow represents the C axis of the sapphire crystal. The sapphire plate is cut and ground so as to be perpendicular to the C axis. As shown in this figure, the angle formed by the optical axis and the C axis of the sapphire is θ. FIG. 2(B) is a figure, which views (A) from the incident light side. A circular sapphire plate is shown in this figure, and the optical axis is perpendicular to the surface of the paper. The solid line double arrow of FIG. 2(B) indicates the direction of polarization of incoming light. The broken line arrow of FIG. 2(B) indicates the projection toward the surface of the paper (surface which is perpendicular to the optical axis) of the C axis of the sapphire crystal, and the actual C axis is heading diagonally upwards from the paper surface by the amount of θ. As shown in FIG. 2(B), the angle formed by this projection of the C axis and the direction of polarization of light is ψ.

In an optically uniaxial crystal like sapphire, if the C axis of the crystal is made correspond to the optical axis; the occurrence of birefringence is prohibited, and the plane of polarization of incoming light is maintained without rotation. However, as explained hereinabove, there are the affects of reflected return light, and the difficulties from the standpoint of manufacturing. On the other hand, the inventors, through experimentation, have formed that, if incoming light is linearly polarized, birefringence can be prevented even without making the optical axis of incident light and the C axis of the sapphire correspond to one another, by making the angle formed by the plane of polarization of incoming light and the C axis equal to 0, and setting both to the same plane. In addition, it was also found that to attain a polarized light extinction ratio of −30 dB, which is a sufficient condition required in the field of optical communications, in the end it is efficient to set the plane of polarization of light and the C axis to the same plane. However, setting the plane of polarization of light and sapphire C axis thereof to exactly the same plane is extremely difficult from the standpoint of manufacturing a housing.

Accordingly, the inventors, as a result of research, succeeded in achieving approximate expressions, which are capable of describing with high accuracy the polarized light extinction ratio of transmitted light when handling only linear polarization, by using the angle θ formed by the optical axis of incident light and the C axis of sapphire; the angle ψ formed by the plane of polarization of incoming light and the C axis of sapphire; the principle index of refraction ω of the sapphire; the secondary refractive index ε of the sapphire; the wavelength λ of the transmitted light; and the thickness d of the sapphire plate. These are the expressions on the (1)–(3) and the right side of (4) described hereinabove. The graphs, of FIG.'s 4–6, respectively, show the dependence of the polarized light extinction ratio on measured values and calculated values of θ and ψ when d is changed. From these graphs, it is clear that the measured values and values calculated using the approximate expressions match up well.

Furthermore, as a result of prototype testing, the inventors discovered the optimum range that enables the realization of a desired polarized light extinction ratio. The inequality of the above-mentioned (4), and the expressions of (5) through (7) when d is 0.28 mm is the optimum range thereof. That is, even if the optical axis of incoming light and the C axis of the sapphire do not correspond, by setting the angle formed by the plane of polarization of the light and the C axis thereof to be small, the condition of a polarized light extinction ratio of −30 dB or less can be satisfied. Conversely, even if manufacturing is made easier by making the angle of the plane of polarization of incoming light and the C axis of the sapphire large, by setting the angle formed by the optical axis of incoming light and the C axis to be small, the condition of −30 dB or less can be satisfied. When (4) is realized, it is desirable for the thickness d of the sapphire plate to be less than 0.3 mm. In the embodiments, which will be explained below, a sapphire plate 0.28 mm thick was used.

Further, by using a semiconductor laser, and connecting a polarization-maintaining (PANDA) fiber to an optical module of the present invention, it is possible to transmit light for which the plane of polarization of the linear polarized light is more accurately maintained at a high level as-is. In this case, a fiber optic amplifier can be utilized efficiently by polarization synthesizing a plurality of excitation lights necessary for a fiber optic amplifier. Therefore, the efficient amplification of a transmitted light signal is possible. Further, the structure of an isolator, which is used together with the optical module of the present invention in optical communications, can be simplified, making possible lower costs.

Further, in a modulator, which uses an optical module of the present invention, and which is manufactured using LN (LiNbO$_3$), which is an anisotropic optical material, since the polarized light extinction ratio of the window is small, it is possible to suppress the birefringence generated inside the LN modulator, enabling the realization of a light signal with a good S/N (signal-to-noise) ratio.

Further, when a semiconductor laser is mounted inside the optical module of the present invention and used, the light loss in the isolator connected outside the window can be held in check.

Furthermore, the optical module of the present invention can comprise a quarter wavelength plate (λ/4 plate). In the past, in a semiconductor light amplifier, the problem was that polarization dependence occurred in the amplification characteristics. However, if a semiconductor light amplifier, which uses the optical module of the present invention, is used after setting the incoming light to the optical module to linear polarization via the λ/4 plate, there is no polarization dependence, and amplification characteristics can be improved. After achieving linear polarization by inserting a λ/4 plate, if the plane of polarization is aligned relative to the C axis of the sapphire, and the λ/4 plate is also YAG welded, the amplification characteristics of a semiconductor light amplifier can be improved even further. Therefore, the insertion loss of a wavelength converting device, or a highspeed operation-capable optical-optical switching device, which is utilized in the semiconductor light amplifier thereof, can be reduced, enabling the realization of an optical signal with a good S/N ratio.

And furthermore, by providing a device which has reflection mechanism for selectively reflecting specified wavelengths, for example, an optical fiber grating, on the outside of the optical module of the present invention, it is possible to make this reflection device resonate together with an optical device on the inside of the optical module. Since the optical, signal oscillation mode disturbance generated by the birefringence of the window can be suppressed at this time, and furthermore, optical signal loss can also be reduced, the optical strength of the signal increases.

If N is set to 0 or an even number in the above-mentioned relational expressions (5)–(7), when light is incident on the sapphire plate, absorption ceases to occur due to the polarization of the sapphire. Thus, the transmittance of the sapphire plate becomes higher, and an optical signal can be transmitted without loss.

DESCRIPTION OF THE PREFERRED EMBODIMENTS

1) Production of an Optical Semiconductor Airtight-Sealed Housing

For the embodiment, an optical semiconductor airtight-sealed housing was produced as follows as an aspect of the optical module of the present invention, such that the following relationship is established between the angle ψ formed by the C axis of sapphire and the plane of polarization of light, and the angle θ formed by the optical axis and the C axis. N is 0.

$$6 \text{ degrees} \leq \theta \leq 10 \text{ degrees and } (90N-9) \text{ degrees} \leq \psi \leq (90N+9) \text{ degrees}$$

Figure 1:
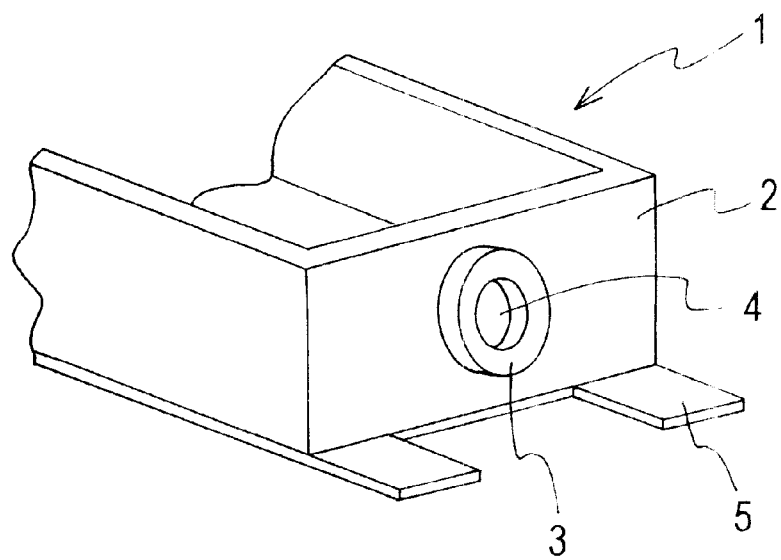
FIG. 1 is a simplified block diagram of the window portion of an airtight-sealed housing.
Figure 2A:
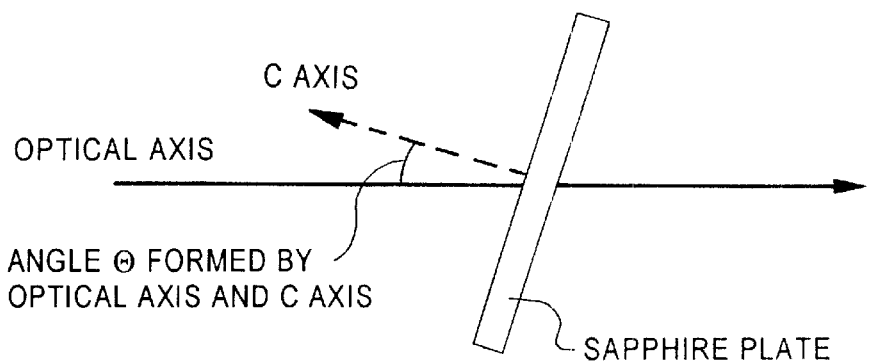
FIG. 2 is illustrations of angles ψ and θ.
Figure 2B:
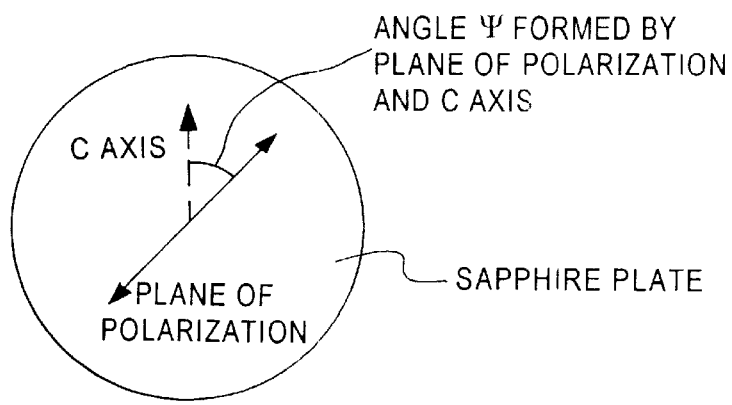

A simplified constitution of the window portion of the formed optical semiconductor airtight-sealed housing is shown in FIG. 1. The overall airtight-sealed housing 1 is constituted by a base plate 5 and a housing sidewall 2. A tubular portion 3 is disposed in housing sidewall 2, and a circular sapphire plate 4 is fitted inside thereof. The housing sidewall 2 part corresponding to sapphire plate 4 is cut into a circular shape, and tubular portion 3 and sapphire plate 4 constitute a light transmissive window.

Optical semiconductor airtight-sealed housing 1 was formed by silver soldering, using kovar for base plate 5, kovar for housing sidewall 2, and kovar in the pipe of tubular portion 3 of the light transmissive window, too. A terminal utilized kovar pin sealed with: a low-melting-point glass and nickel-goled plated. To fit sapphire plate 4 into housing sidewall 2, a pipe, having a plane inclined by angle θ relative to the sidewall, was silver soldered as tubular portion 3, such that the plane at angle θ inclined by ψ relative to the plane of polarization of incoming light. In actuality, a cylindrical hole was made in housing sidewall 2, and a cylindrical pipe was fitted therein and aligned with a carbon jig. The thickness of the sapphire plate used was 0.28 mm, the refractive index of the sapphire thereof was 1.7679 along the C axis, and was 1.7596 at the plane perpendicular to the C axis. The sapphire plate 4 had a surface perpendicular to the C axis. Since the C axis has variance actually, the carbon jig was designed to make θ and ψ small. An AR (anti reflection) coating of MgF was applied to the sapphire. As for the coating here, a multi-layered film of TiO and SiO can be used instead of MgF. When θ is a Brewster angle, if ψ is made small, approaching 0 degrees, an AR coating need not be applied to the sapphire plate. The metallization on top of the sapphire plate was Ti/Pt/Au from the sapphire side. The sapphire plate was sealed and bonded to airtight-sealed housing 1 by AuSn soldering.

2) Measurement of Polarized Light Extinction Ratio

Figure 3:
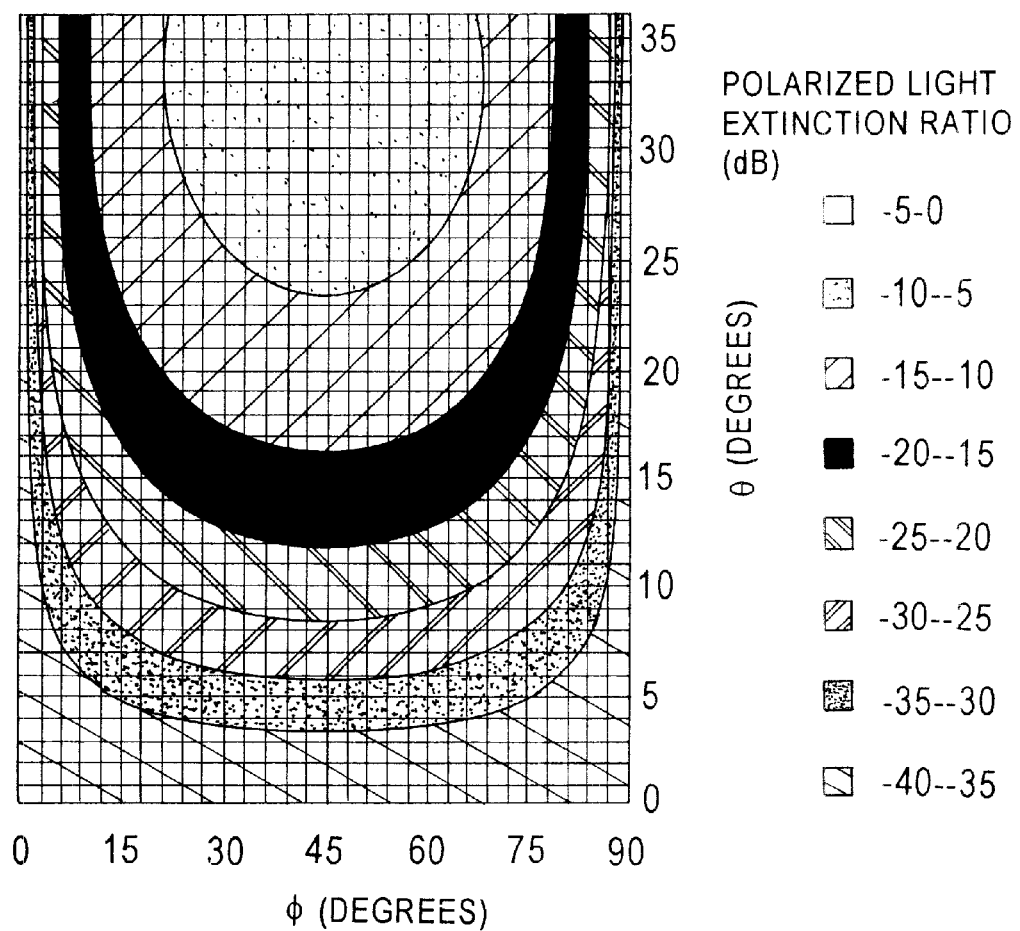
FIG. 3 is a diagram showing the relationship of angles ψ, θ and the polarized light extinction ratio.
Figure 4:
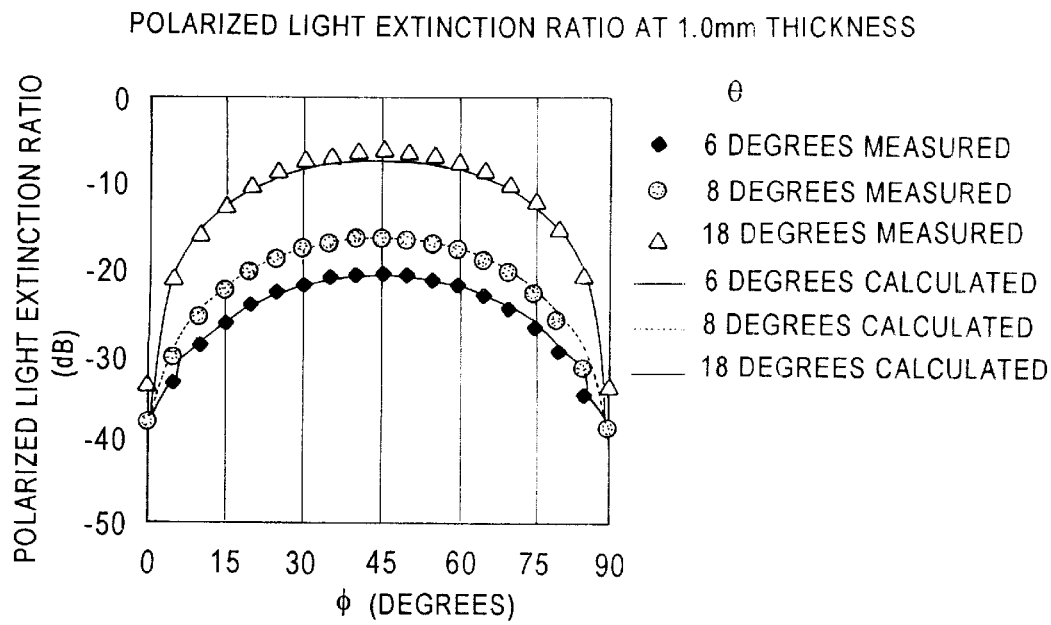
FIG. 4 is a graph showing the relationship of angles ψ, θ and the polarized light extinction ratio when d is 1.0 mm and λ is 1.48 μm (0.00148 mm)
Figure 5:
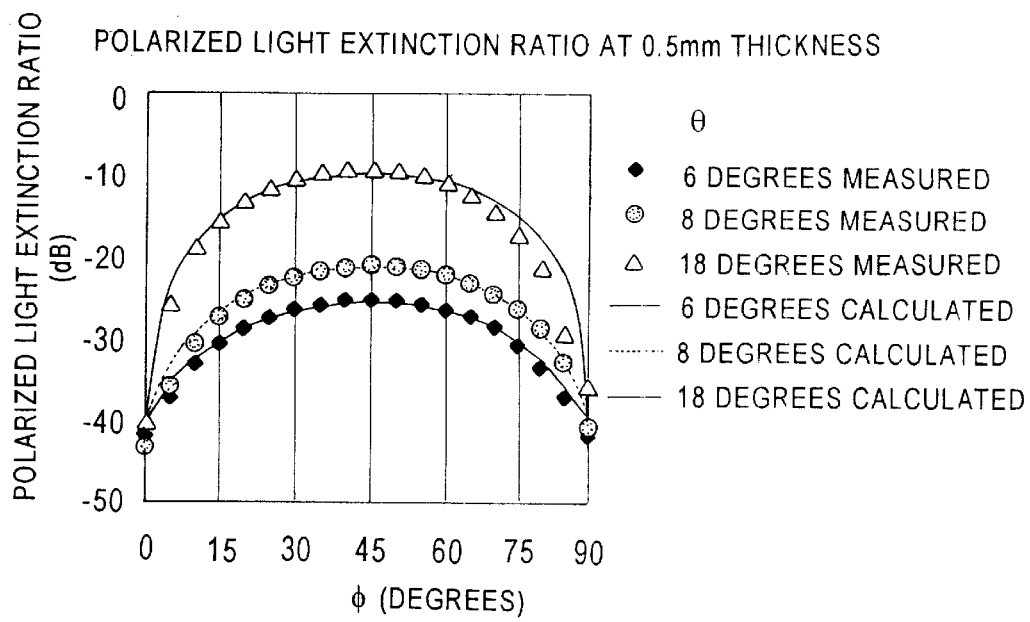
FIG. 5 is a graph showing the relationship of angles ψ, θ and the polarized light extinction ratio when d is 0.5 mm and λ is 1.48 μm (0.00148 mm)
Figure 6:
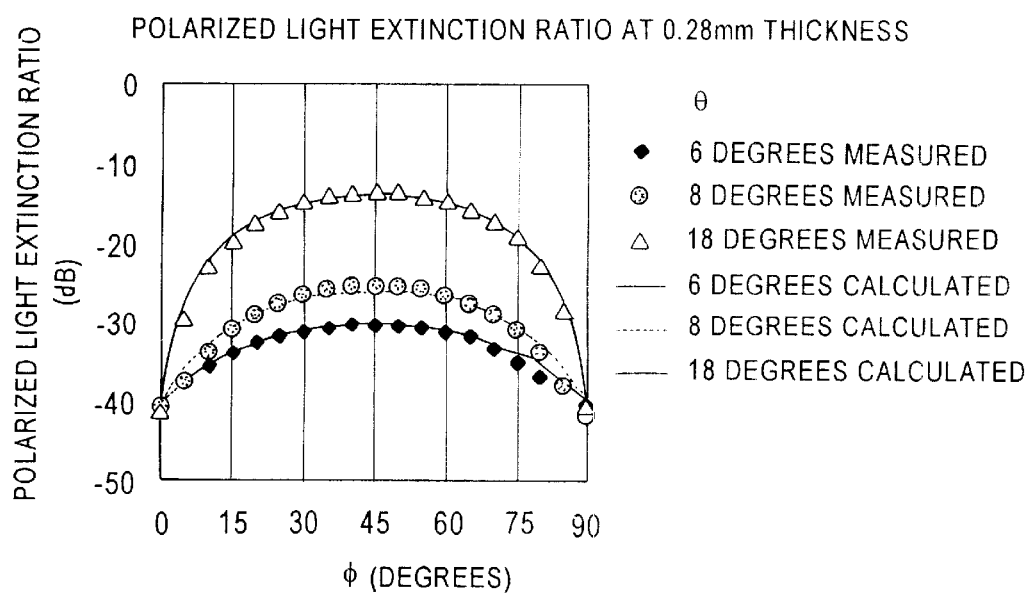
FIG. 6 is a graph showing the relationship of angles ψ, θ and the polarized light extinction ratio when d is 0.28 mm and λ is 1.48 μm (0.00148 mm).

With regard to an optical semiconductor airtight-sealed housing produced as described hereinabove, θ and ψ were made parameters, and the polarized light extinction ratio following the passage of an optical signal through the sapphire plate window was determined. Here, a LD (laser diode) beam was used, the λ of which was 1.48 μm (0.00148 mm). The results thereof are shown in the graph of FIG. 6. From the graph thereof, it is clear that values calculated using the approximate expressions match up well with measured values. Furthermore, to clearly indicate the ranges of θ and ψ, these ranges are illustrated in the graph of FIG. 3. In FIG. 3, the horizontal axis represents ψ, the vertical axis represents θ, and areas of different shades of gray represents a polarized light extinction ratio. The polarized light extinction ratio has periodicity of 90 degrees relative to ψ, and a maximum point and a minimum point are repeated every 90 degrees. It was learned that in each area represented by a shade of gray, when ψ is 45 degrees, the polarized light extinction ratio takes the maximum value no matter what angle θ is, and when ψ is 0 degrees and 90 degrees, the polarized light extinction ratio takes the minimum value no matter what angle θ is. When ψ is shifted 45 degrees, which is a half period from 0 degrees, the maximum and minimum of the polarized light extinction ratio change places. When ψ is in the vicinity of 0 degrees and 90 degrees, at which the polarized light extinction ratio becomes maximum, the polarized light extinction ratio does not vary much even when θ increases. However, when ψ is in the vicinity of 45 degrees and 135 degrees, at which the polarized light extinction ratio becomes minimum, the polarized light extinction ratio changes greatly in accordance with the fluctuation of θ. The ranges of θ and ψ at which the polarized light extinction ratio achieved the −30 dB or less required in optical communications were as follows.

6 degrees≦θ≦10 degrees and (90N−9) degrees≦ψ≦(90N+9) degrees 2 degrees≦θ<6 degrees and (90N−32) degrees≦ψ≦(90N+32) degrees 10 degrees<θ≦14 degrees and (90N−5) degrees≦ψ≦(90N+5) degrees (N is an integer)

Further, upon comparing the intensity of light transmitted through the window in the cases that ψ was 0 degrees and 90 degrees, light intensity increased to 0.2 dB when ψ was 0 degrees. Therefore, for this embodiment, it was clear that the transmittance of the sapphire window was enhanced by setting N to 0 when producing the optical semiconductor airtight-sealed housing.

3) PANDA-bonded Optical Module

An optical module was produced by YAG bonding one polarization-maintaining fiber (PANDA) to the outside of an optical semiconductor sealed housing produced as described hereinabove. By utilizing the optical module of the present invention, it was possible to transmit a light signal the linear polarization of which was maintained as-is at a high level. Furthermore, a fiber optic amplifier was utilized efficiently by polarization synthesizing a plurality of excitation light necessary for a fiber optic amplifier. At the same time, it was possible to make the structure of an isolator simpler.

4) Semiconductor Laser Device-attached Optical Module

A semiconductor laser device was hybrid integrated with an optical semiconductor sealed housing formed as described hereinabove. By using the optical semiconductor sealed housing of the present invention, the light loss in an isolator connected to the outside of the window was suppressed.

5) Optical Module Attached With Optical Waveguide Device, Using Anisotropic Optical Material Using the optical semiconductor sealed housing produced as described hereinabove, a Mach-Zehnder device was attached, and a modulator, which utilizes the anisotropic optical material LN, was produced. By using the optical semiconductor sealed housing of the present invention, the birefringence generated on the inside of the LN modulator was suppressed, enabling the realization of an optical signal with a good S/N ratio.

6) Semiconductor Light Amplifying Device-attached Optical Module

A semiconductor light amplifying device was hybrid integrated with the optical semiconductor sealed housing produced as described hereinabove, and a semiconductor light amplifier was formed. On the outside of the sapphire plate window of the semiconductor light amplifier thereof, a λ/4 plate was also attached. Incoming light from an optical fiber was linearly polarized by passing through the λ/4 plate, and when a light signal was amplified using the semiconductor light amplifier thereof, it was possible to enhance amplification characteristics without giving rise to polarization dependence. In a wavelength converting device, or a highspeed operation-capable optical-optical switching device, which the semiconductor light amplifier thereof utilizes, insertion loss was reduced, achieving signal light with a good S/N ratio. Further, after linear polarization was achieved by passing through the λ/4 plate, the plane of polarization was aligned, YAG welding was performed, and thus a semiconductor light amplifier was produced. Thus, in this case, it was possible to enhance light amplification characteristics even further.

7) Optical Module Comprising Reflection Mechanism

An optical fiber grating, which is a device having a reflection mechanism for selectively reflecting a specified wavelength, was disposed on the outside of the optical module produced as described hereinabove. It was possible to suppress the disturbance of the incoming light oscillation mode at this time, enabling the production of an optical module with outstanding wavelength selectivity. Furthermore, light signal loss was also reduced, and light intensity was increased.

The optical module of the present invention is easy to manufacture, is mechanically strong, and does not cause the deformation of the plane of polarization of a light signal. Furthermore, the optical module of the present invention has a small polarized light extinction ratio of −30 dB or less, and is ideal for use in optical communications. Further, the optical module of the present invention has high emitted light intensity, and the mode stability of emitted light is excellent.

What is claimed is:

1. An optical module, having:

a housing; and a junction having a light transmissive window structure which uses a sapphire plate cut so as to be perpendicular to a C axis of the sapphire, wherein the following expressions (1)–(4) are established between an angle ψ as viewed from the optical axis, formed by the C axis of the sapphire and the plane of polarization of light, which is linear polarization, and an angle θ formed by the C axis of the sapphire and the optical axis:

$$n = \omega\epsilon/\sqrt{(\omega^2\cos^2\theta + \epsilon^2\sin^2\theta)} \quad (1)$$

$$\delta = 2\pi d(\omega - n)/\lambda \quad (2)$$

$$\tan\beta = \frac{\sqrt{(\sin^2 2\psi \sin^2 \delta + 1)} - 1}{\sin 2\psi \sin \delta} \quad (3)$$

$$-30 \geq +20\log(\tan\beta) \quad (4)$$

where,

ω: Principal refractive index of the sapphire

ε: Secondary refractive index of the sapphire

λ: Wavelength of a transmitted light d: The sapphire plate thickness.

2. An optical module according to claim 1, wherein, when the thickness d of said sapphire plate is 0.28 mm, and N is an integer, any one of the following expressions (5) through (7) is established between said angle ψ and said angle θ:

6 degrees≦θ≦10 degrees, and (90N−9) degrees≦ψ≦(90N+9) degrees     (5)

2 degrees≦θ<6 degrees, and (90N−32) degrees≦ψ≦(90N+32) degrees     (6)

10 degrees≦θ<14 degrees, and (90N−5) degrees≦ψ≦(90N+5) degrees.     (7)

3. An optical module according to claim 1, further having at least one polarization maintaining fiber.

4. An optical module according to claim 1, further comprising any one of a semiconductor laser device, a semiconductor light amplifying device, or an optical waveguide device which utilizes an anisotropic optical material.

5. An optical module according to claim 1, further comprising a quarter wavelength plate.

6. An optical module according to claim 1, comprising a reflection device outside of said housing for reflecting light of a specified wavelength.

7. An optical module according to claim 2, wherein said N is either 0 or an even number.

* * * * *